US006879487B2

United States Patent
Simon et al.

(10) Patent No.: US 6,879,487 B2
(45) Date of Patent: Apr. 12, 2005

(54) FAN-SECURING DEVICE FOR USE WITH A HEAT TRANSFER DEVICE

(75) Inventors: Glenn C. Simon, Auburn, CA (US); Vella Srinivas, Bangalore (IN); Angela Minichiello, Millville, UT (US); Brad Clements, Fort Collins, CO (US); Christopher Paul Lucas, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/677,151

(22) Filed: Sep. 30, 2003

(65) Prior Publication Data

US 2004/0047129 A1 Mar. 11, 2004

Related U.S. Application Data

(63) Continuation of application No. 10/180,426, filed on Jun. 25, 2002, now Pat. No. 6,650,541.

(51) Int. Cl.[7] .............................................. H05K 7/20
(52) U.S. Cl. ...................... 361/697; 165/80.3; 165/121; 165/126; 165/185; 257/722; 257/719; 361/703; 361/704; 361/710; 615/177; 615/213.1

(58) Field of Search ............................... 165/80.3, 121, 165/122, 185; 257/722, 718–719; 361/687, 694–695, 697, 703

(56) References Cited

U.S. PATENT DOCUMENTS

| 4,745,456 | A | | 5/1988 | Clemens |
| 5,377,745 | A | * | 1/1995 | Hsieh .......................... 165/80.3 |
| 5,677,829 | A | * | 10/1997 | Clemens ....................... 361/697 |
| 5,828,550 | A | | 10/1998 | Horng |
| 5,882,047 | A | | 3/1999 | Ostrander et al. |
| 6,152,214 | A | * | 11/2000 | Wagner ........................ 165/121 |
| 6,392,885 | B1 | * | 5/2002 | Lee et al. .................... 361/697 |
| 6,414,848 | B1 | | 7/2002 | Chen |

FOREIGN PATENT DOCUMENTS

| GB | 2312262 | 10/1997 |
| JP | 10308487 | 11/1998 |

* cited by examiner

Primary Examiner—Gregory Thompson

(57) ABSTRACT

A fan-securing device secures a fan to a heat transfer device that allows for the rapid removal of the fan without disturbing the remainder of the heat transfer device. The fan-securing device includes a base, a fastener for securing the body base to the heat transfer device, and compression tabs for securing the fan to the base.

34 Claims, 6 Drawing Sheets

FAN-SECURING DEVICE FOR USE WITH A HEAT TRANSFER DEVICE

RELATED APPLICATIONS:

This application is a continuation of and claims priority from U.S. patent application Ser. No. 10/180,426, filed Jun. 25, 2002, now U.S. Pat. No. 6,650,541, by Glenn C. Simon et al., which is incorporated herein by reference in its entirety.

FIELD

The present invention relates generally to the field of heat transfer devices. More specifically, the present invention relates to a fan retainer clip that allows the field removal of a defective fan from a heat transfer device without disturbing the heat transfer device or the component it is cooling.

BACKGROUND

The electronics and computer industries are constantly expanding and pushing the limits of both performance and quality. The increased speeds and reduction in component size requirements have also required increased performance from cooling systems to prevent product degradation due to high performance temperatures. In general, heat transfer systems transfer heat from a heat-generating source to the surrounding air by the use of a combination of fans and heat transferring fins or heat sinks. As used herein, and in the appended claims the terms "heat transfer device" or "heat sink" will be understood to refer to all such devices that transfer heat from components using any combination of fans, fins or similar members.

Generally, heat transfer systems use a combination of conduction and convection or forced convection to transfer heat from heat generating components. A heat-producing component is placed in contact with the base of the heat transfer device. The heat transfer device is made of a material that readily conducts or transfers thermal energy through contact. Examples of such materials include aluminum and copper. The heat from the heat producing electronic device is transferred through the conductive base to the rest of the heat transfer device. The base of the heat transfer device is formed with a number of fins or other shaped extrusions that maximize surface area on the opposing side of the contact surface. The transferred thermal energy is then transferred from the conductive base to the fins. The thermal energy is then transferred from the large surface area of the fins to the surrounding medium (air or liquid) through convection. Convection is the flow of thermal energy from a solid to a liquid or gaseous medium. In most heat transfer devices, the use of stagnant air is not sufficient so the convection (or transfer of heat energy from the solid to the liquid/gaseous medium) is increased through forced convection. Forced convection includes the use of a fan or other transfer device to force the liquid/gaseous medium over the increased surface area of the fins. This increased flow of the liquid/gaseous medium increases the transfer of heat energy from the fins to the cooling medium thereby increasing the rate of cooling of the heat-producing component.

During the heat transfer process, the circulation of the air, and therefore the rate of transfer of the heat energy from the fins, is dependant upon the performance of the fan. If the fan is under performing or malfunctioning it may effectively reduce the efficiency of the heat transfer device and damage the electronic heat-producing component by allowing it to overheat. When the fan of a heat transfer device is malfunctioning, a great need arises to immediately replace it. Replacement of a faulty fan produces a number of problems due to the current manner of securing the fan to the base of the heat transfer device.

FIG. 6 illustrates a conventional heat transfer system. As shown in FIG. 6 and described in U.S. Pat. Nos. 6,345,664 and 6,351,044 (which are incorporated herein by reference), a cooling fan (50) is generally attached to the base (44) of a heat transfer device by adhesives (60). The fan (50) includes fan blades (52) that, when rotated, force air or other cooling medium over a set of fins (42). Power for the fan (50) is provided through a wire (56). The prior solution of using adhesive (60) to attach the fan (50) to the heat sink is not field-repairable and involves complicated heat sink removal procedures in the case of a failed heat sink fan. Additionally, the complexity of the removal procedures increases the amount of down time needed to replace a faulty fan and usually disturbs both the functioning of the heat producing component and the heat transfer device.

Other prior art solutions involve screwing the fan to the heat transfer device by placing screws through the fan housing. In many cases, however, there is no fan housing; rather the fan motor needs to be directly attached to the fin base of the heat transfer device. Screwing the fan to the base would be possible with a number of plastic fan designs, but the screw heads would be difficult to reach without disturbing the heat transfer device, and it is unlikely that fan vendors will be willing to incur increased costs by changing the design of their fan housings.

U.S. Pat. No. 6,109,340; U.S. Pat. No. 5,484,013; and U.S. Pat. No. 5,615,998 (incorporated herein by reference) demonstrate attempted solutions to the problems associated with connecting the fan by adhesives. In U.S. Pat. No. 6,109,340, the fan is integrally connected to the fan housing which is then designed to be easily removed and attached to the heat transfer device. However, by integrally connecting the fan to the housing it becomes impossible to replace the fan without replacing both the fan and the fan housing. This increases both replacement costs and manufacturing costs of the fan due to increased complexity of molds required to form the fan and housing as well as increasing the material required to manufacture the part.

Another possible solution to the removal problems associated with bonding the cooling fan with adhesives is addressed by U.S. Pat. No. 6,343,012 and U.S. Pat. No. 5,969,941. (incorporated herein by reference). In these patents, a retaining clip is affixed to the heat transfer device containing female threads. The fan is then manufactured with corresponding male threads integrally connected to the base of the cooling fan. To assemble the invention the male threads are affixed to the female threads of the retaining clip. While the fan is manufactured independently of the retaining clip, overall manufacturing costs of the fans are increased due to the increased complexity of the threaded base. Additionally, it is both difficult and time consuming to rotatably release a fan in compact situations such as cylindrically shaped heat transfer devices.

SUMMARY

One embodiment of the present invention provides a fan-securing device for securing a fan to a heat transfer device that allows for the rapid removal of the fan without disturbing the remainder of the heat transfer device. The fan-securing device includes a base, a fastener for securing the body base to the heat transfer device, and compression tabs for securing the fan to the base.

In another embodiment, the present invention provides a heat transfer device that includes a heat transfer base for contacting with a heat producing component, fins protruding from the heat transfer base for conducting heat from the heat transfer base; a fan for transferring air through the fins; and a fan-securing device that includes a body, a hole and compression tabs, where the tabs come in contact with the base of the fan thereby securing the fan in the fan-securing device.

In another embodiment, the present invention provides a fan-securing device for securing a fan to a heat transfer device that allows for the rapid removal of the fan without disturbing the remainder of the heat transfer device. The fan-securing device includes a body, a securing means for securing the body to the heat transfer device, and a retaining means for retaining the fan to the body, the retaining means being releasable.

In another embodiment, the present invention provides a method for securing a fan to a heat transfer device that allows for the rapid removal of the fan without disturbing the remainder of the heat transfer device by attaching a fan-securing device having compression tabs to the base of the heat transfer device, and pushing the fan into the fan-securing device such that the compression tabs securely attach the fan to the fan-securing device.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate similar, though not necessarily identical, elements.

DETAILED DESCRIPTION OF THE PREFERRED EMBODIMENTS

Figure 1:
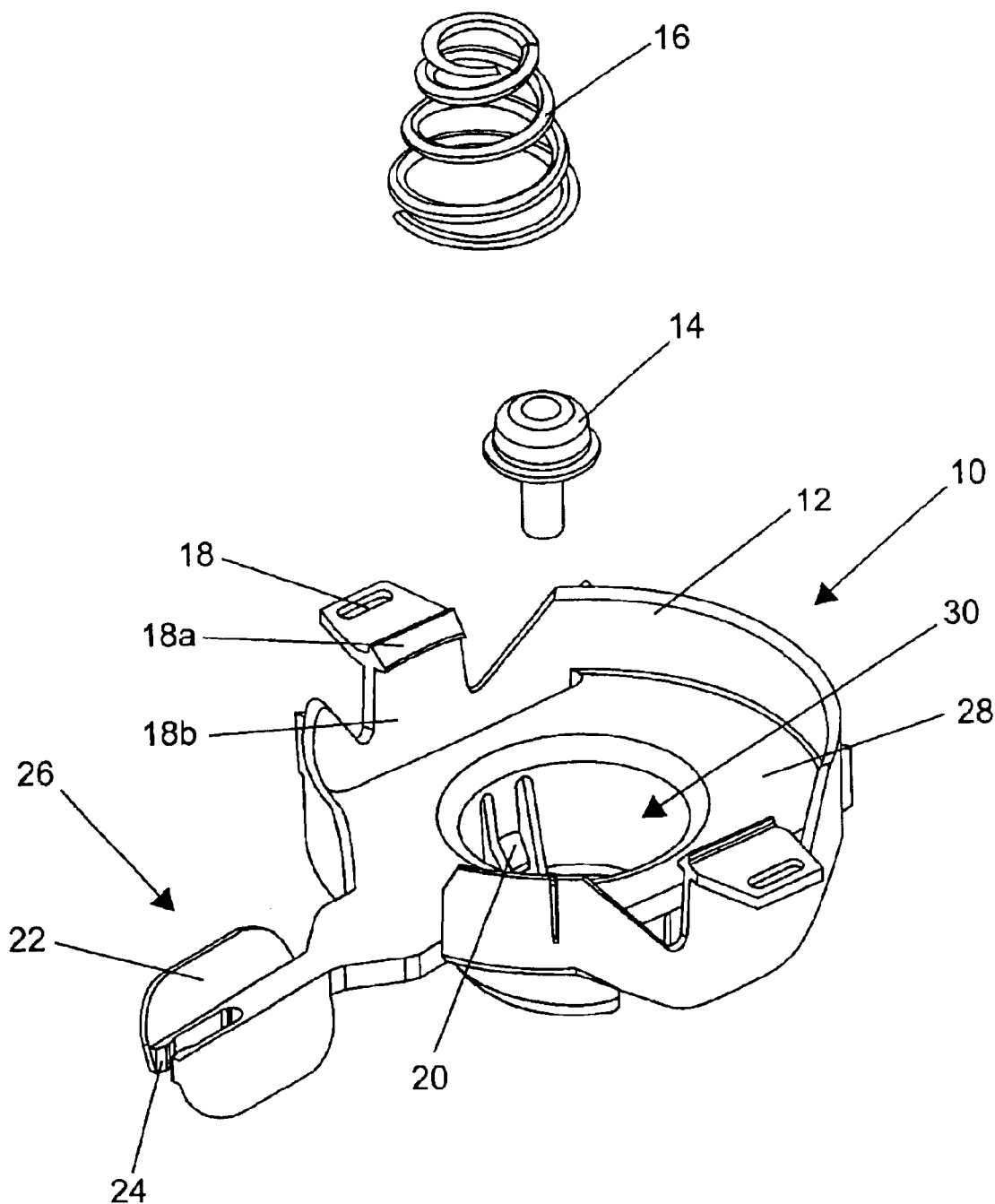
FIG. 1 shows an exploded perspective view of an embodiment of a fan-securing apparatus according to principles of the present invention.

FIG. 1 illustrates an embodiment of a fan-securing device according to the principles of the present invention. As shown in FIG. 1, such a fan-securing device (10) preferably includes a base or body (28), a recessed receiver member (30), a hole in the middle of the recessed receiver member (not shown), a side housing (12), compression tabs (18) with protruding pawls (18a) and a compression tab neck (18b), a spring retaining clip (20), a wire guard (26) with compression legs (24) and release tabs (22), a spring (16), and a screw (14).

Figure 2:
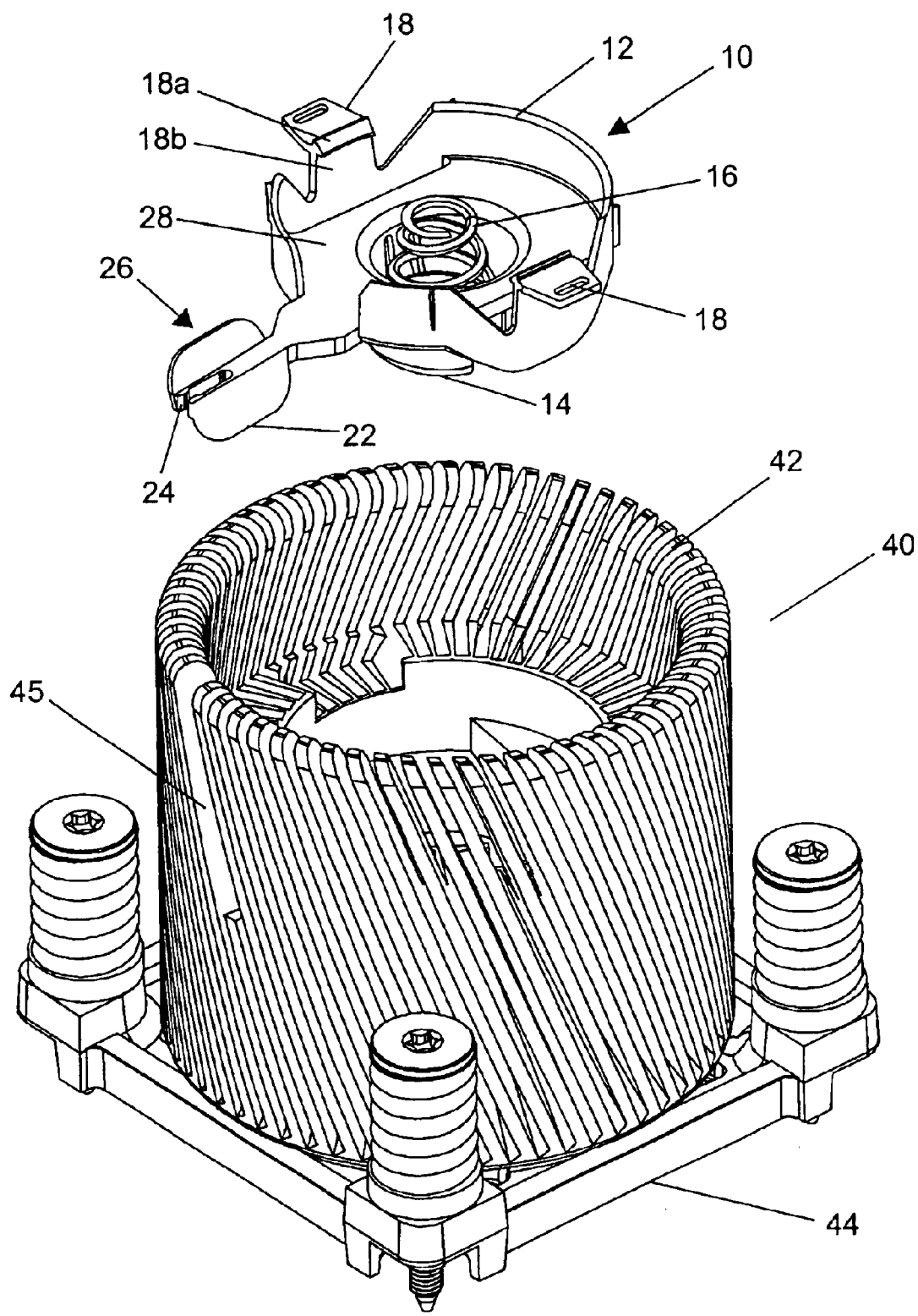
FIG. 2 shows an assembled perspective view of an embodiment of the fan-securing apparatus in conjunction with a heat transfer device.

FIG. 2 illustrates how an embodiment of the fan-securing device (10) is secured to a heat transfer device (40). Heat transfer device (40) preferably includes a base (44) and a cylindrically-shaped set of fins (42). When securing the fan-securing device (10) to the heat transfer device (40), a hole is first tapped into the heat transfer device (40). This hole is for receiving the screw (14) used to secure the fan-securing device (10). The fan-securing device (10) is lowered onto the heat transfer device (40) lining up the hole (not shown) in the center of the recessed receiver member (30) with the tapped hole in the heat transfer device (40). Once the holes are lined up, the screw (14) is threaded into the tapped hole thereby securing the base (28) of the fan-securing device (10) to the base (44) of the heat transfer device (40).

FIG. 2 illustrates that a portion of a fin may be removed from the set of fins (42) on the heat transfer device base (44) to form a gap (45). This gap (45) provides clearance for the wire guard (26) when the fan-securing device (10) is installed. Once the base (28) of the fan-securing device (10) has been secured to the base (44) of the heat transfer device (40), the spring (16) is inserted into the recessed receiver member (30). Preferably, the spring (16) is a conical snap-in spring, which fits tightly over the head of the screw (14). The interference fit between the conical spring (16) and the head of the screw (14) prevents movement or loss of the screw (14). Additionally, some embodiments of the invention may include a spring retaining clip (20), which protrudes from the side of the recessed receiver member (30). Once the spring (16) is inserted into the recessed receiver member (30), the protruding nature of the spring retaining clip (20) prevents the spring (16) from exiting.

Figure 3:
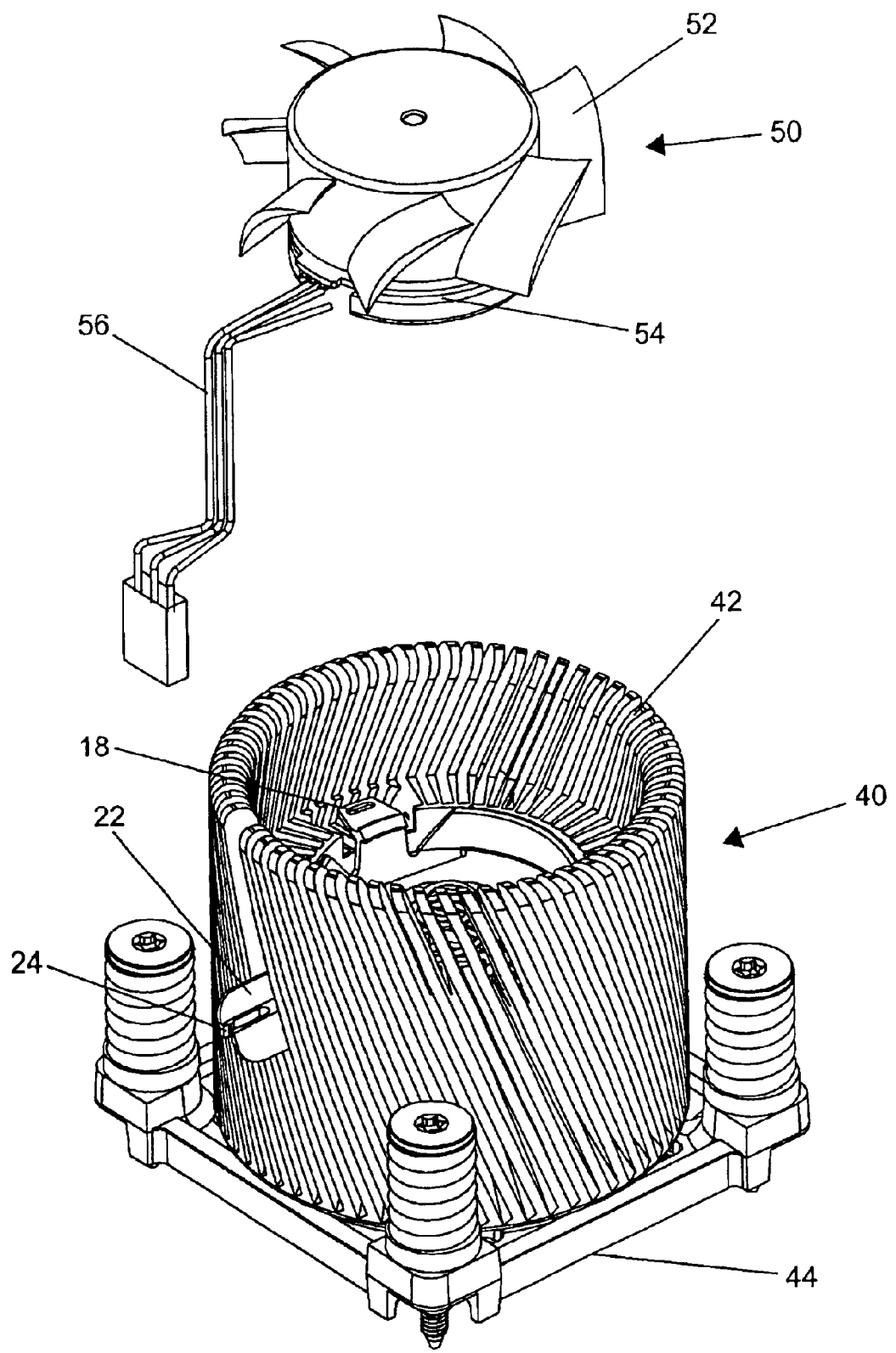
FIG. 3 shows a perspective view of an embodiment of the present invention secured to the heat transfer device in conjunction with a cooling fan.
Figure 4:
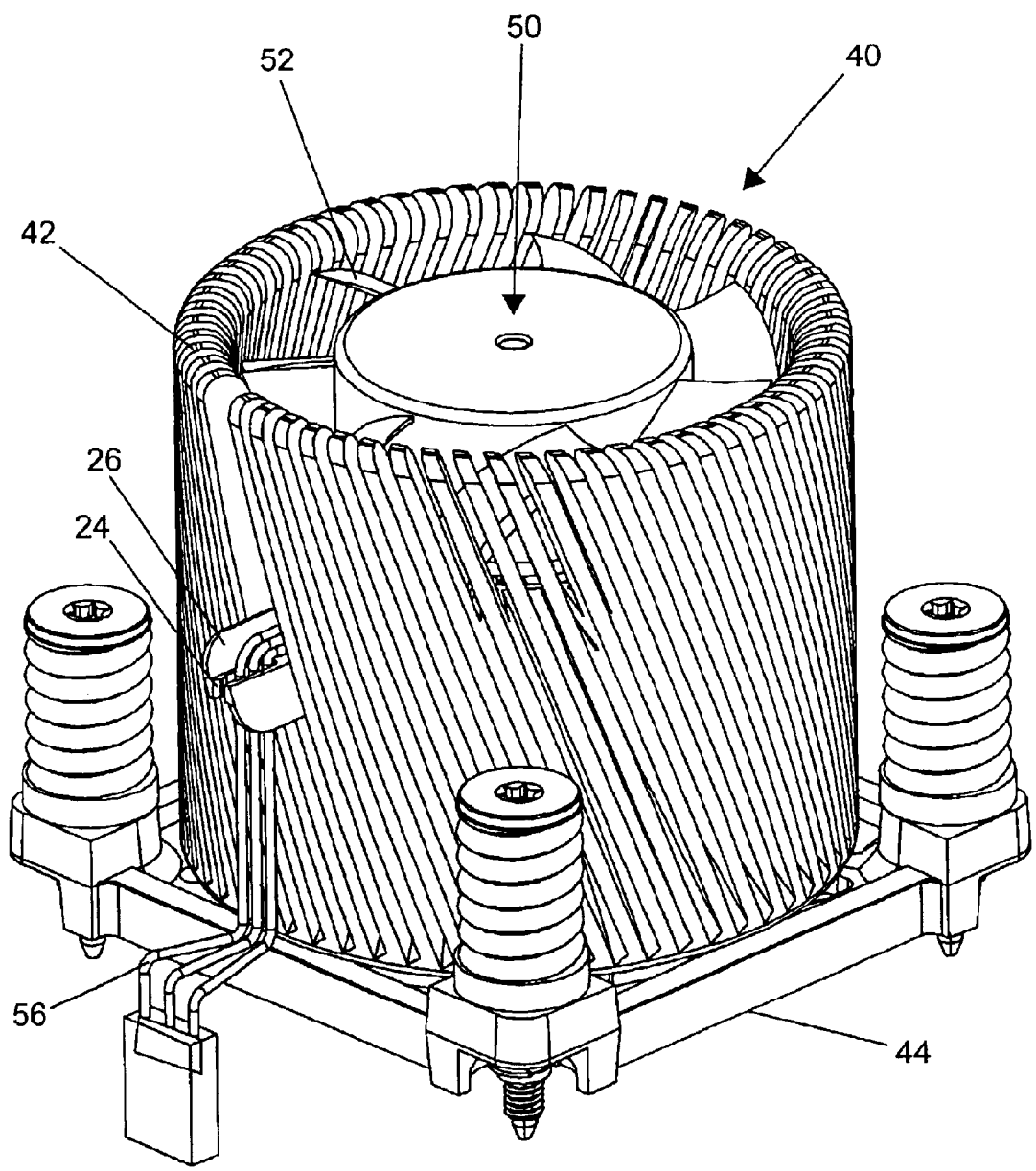
FIG. 4 shows a perspective view of an embodiment of the present invention fully assembled.

Once the fan-securing device (10) is attached to the base (44) of the heat transfer device (40), the fan (50) may be inserted as demonstrated by FIGS. 3 and 4. FIG. 3 shows the fan (50) as it is about to be installed into the fan-securing device (10). To secure the fan (50), the fan is simply pushed down into the center of the fan-securing device (10). As the fan (50) is pushed towards the base (28) of the fan-securing device (10) the spring (16) is compressed.

When the fan (50) is inserted in the fan-securing device (10) to the base (28), the compression tabs (18) are able to secure the fan (50). The protruding pawls (18a) located on the fan side of the compression tabs (18) engage with a recessed groove (54) on the base of the fan (50). FIG. 4 illustrates the fan (50) fully installed in the fan-securing device (10) and the heat transfer device (40).

Figure 5:
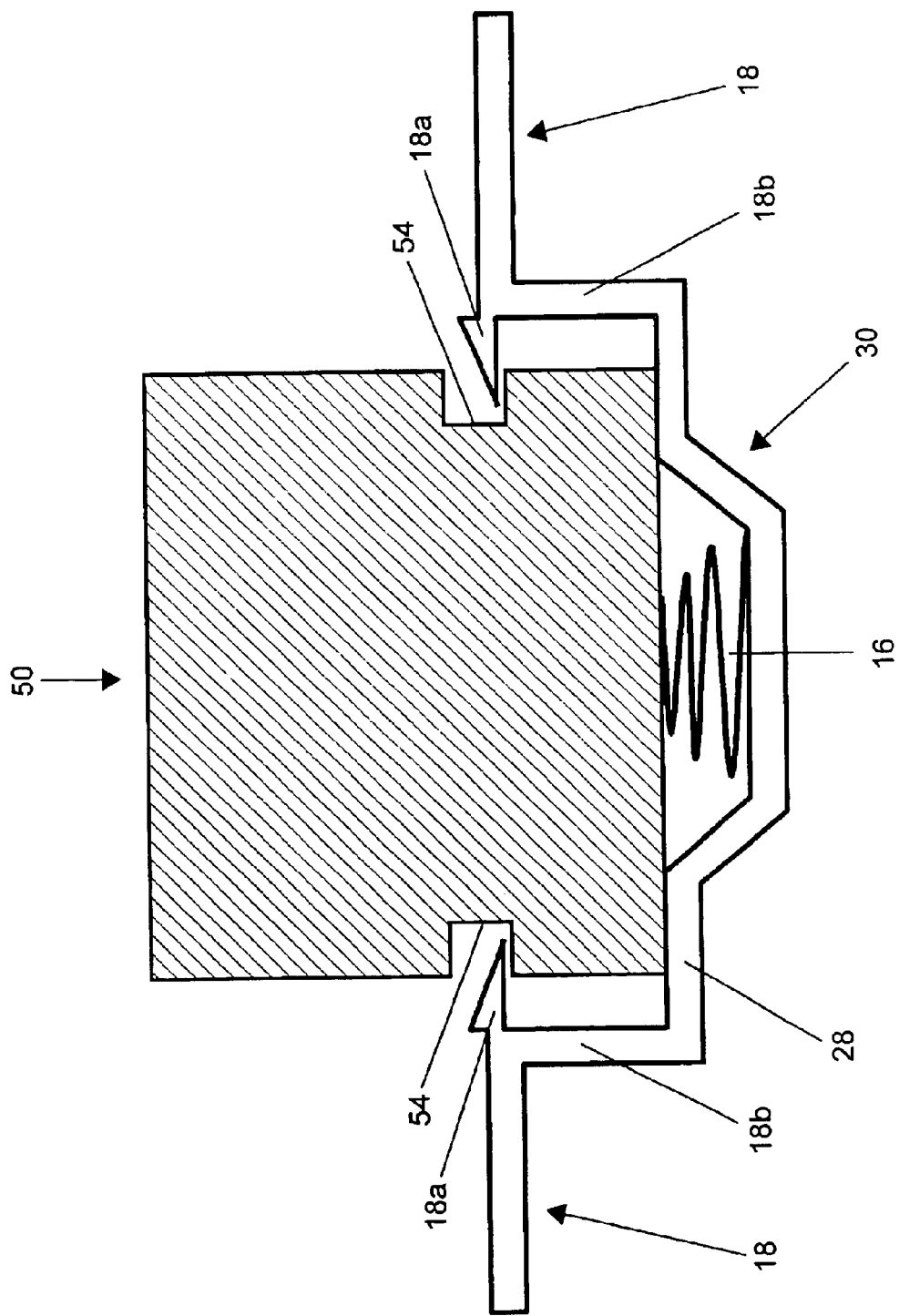
FIG. 5 is a cross-sectional view of an embodiment of a compression tab according to principles of the present invention.
Figure 6:
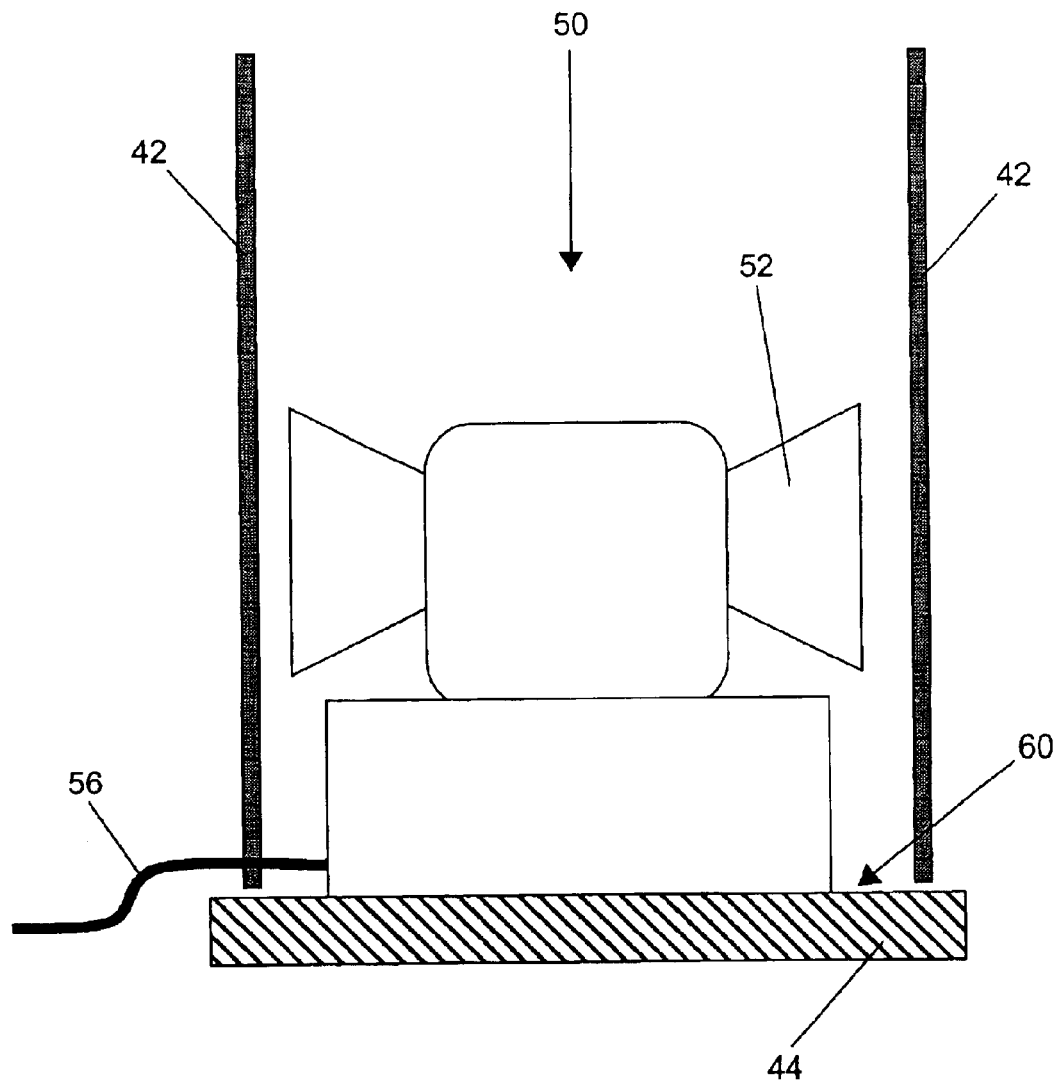
FIG. 6 illustrates a heat dissipating apparatus according to the prior art.

FIG. 5 illustrates an embodiment of the present invention where the protruding pawls (18a) engage with the recessed groove (54) of the fan (50). Once the pawls (18a) have engaged, they secure the fan (50) by preventing it from moving vertically. Additionally, the side housing (12) prevents the fan (50) from translational movement thereby securing it in the fan-securing device (10). The spring (16) also pushes the fan (50) upward against the pawls (18a). This ensures a tight and secure fit between the pawls (18a) and the fan (50) and compensates for any dimensional variability in the assembly components.

The recessed groove (54) can be provided in several ways. In one embodiment, the groove is formed by the interface between two different pieces, 1) the fixed motor base of the fan and 2) the fan rotor. In this embodiment, the "groove" (54) is actually a natural gap between these two components, the motor base and fan rotor. The pawls (18a) grab onto the non-rotating piece, the motor base. In alternative embodiments, the groove (54) may be an interface between components of the fan or an actual groove carved in an exterior housing or other component of the fan.

Upon securing the fan (50) to the fan-securing device (10), the fan wires (56; FIG. 4) are inserted to the wire guard (26; FIG. 4). The wires (56) are inserted into the compression legs (24), which compress the fan wires (56). By securing the fan wires (56), the compression legs (24) prevent the fan wires (56) from interfering with the fan blades (52) and from chafing against the sharp fin edges (42).

To remove the fan (50) from the heat transfer device (40), the compression tabs (18) are pushed one at a time with a small screwdriver or other instrument. When the compression tabs (18) are pushed downward the neck of the compression tabs (18b) bend retracting the protruding pawl (18a) from the recessed groove (54) in the fan (50). When the protruding pawl (18a) is retracted enough to reduce the interference between the protruding pawl (18a) and the recessed groove (54), the spring (16) ejects the fan (50). The fan wires (56; FIG. 4) are then released by applying pressure in opposing directions to the release tabs (22) on the wire guard (26; FIG. 4). The pressure spreads the compression legs (24) thereby widening the gap allowing for the removal of the fan wires (56).

It will be appreciated by those of skill in the art, that the function of the recessed groove (54) could alternatively be performed by a number of configurations. One alternative configuration includes protruding notches on the base of the fan (50), each of which corresponds to a compression tab (18). When the protruding notch is inserted past the compression tab (18), the interference with the protruding pawl (18a) is again formed, securing the fan (50). Other securing configurations may include interference posts in conjunction with a hole or additionally a compression ring could be used to secure the fan (50).

It will also be appreciated by those of skill in the art, that the fan-securing device (10) doesn't have to be secured to the base of the heat transfer device (40) by the screw (14). An adhesive or any other securing means known in the art could secure the fan-securing device and still perform the desired function of allowing easy and quick removal of a malfunctioning fan.

Moreover, it will be appreciated by those of skill in the art that the invention could be made of a number of materials including, but not limited to, plastic, aluminum, or copper. Moreover, a number of processes may be employed to form the invention including, but not limited to, injection molding, thermo molding, pressing, stamping, casting, or milling.

In conclusion, the present invention, it its various embodiments, reduces the assembly and removal time of a fan (50) associated with a heat transfer device (40). Moreover, the invention is designed so that a fan snaps into the fan-securing device (10) and is easily removable, allowing replacement of a failed fan (50) without disturbing the heat transfer device (40) or the component it is cooling.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as is suited to the particular use contemplated. It is intended that the scope of the invention be defined by the following claims.

What is claimed is:

1. A fan-securing device that secures a fan to a heat transfer device and enables rapid removal of the fan without disturbing a remainder of the heat transfer device, said fan-securing device comprising:
    a base;
    a fastener for releaseably securing said base to said hear transfer device;
    compression tabs for securing said fan to said base;
    a spring; and
    a recessed receiver member in said base for receiving said spring directly under the fan for aiding in discharge.

2. The fan-securing device of claim 1, wherein said heat transfer device is a heat sink.

3. The fan-securing device of claim 1, wherein said base is made of plastic.

4. The fan-securing device of claim 1, further comprising:
    a spring retaining clip on a side of said recessed receiver member for retaining said spring in said recessed receiver member.

5. The fan-securing device of claim 1, further comprising:
    a wire guard for protecting fan wires from fan blades and sharp fin edges, said guard being integrally connected to said base.

6. The fan-securing device of claim 4, wherein said wire guard comprises:
    compression legs for securing said wires; and
    tabs for releasing said compression legs.

7. The fan-securing device of claim 1, wherein said fastener comprises a screw that engages a corresponding hole in said fan-securing device and secures said base to said heat transfer device.

8. A heat transfer device comprising:
    a heat transfer base for contacting with a heat producing component;
    fins protruding from said heat transfer base for conducting heat from said heat transfer base;
    a fan for transferring air through said fins; and
    a fan-securing device releaseably secured to said heat transfer base, said fan-securing device comprising:
        a body and compression tabs wherein said tabs come in contact with said fan thereby securing said fan in said fan-securing device;
        a spring for aiding in removal of said fan; and
        a recessed receiver member in said body for receiving said spring directly under said fan.

9. The heat transfer device of claim 8, wherein said fan-securing device is made of plastic.

10. The heat transfer device of claim 8, wherein said fan-securing device further comprises:
    a spring retaining clip on a side of said recessed receiver member for retaining said spring in said recessed receiver member.

11. The heat transfer device of claim 8, wherein said fan-securing device further comprises:
    a wire guard for protecting fan wires from fan blades and sharp fin edges, said guard being integrally connected to said fan-securing device.

12. The heat transfer device of claim 11, wherein said wire guard comprises:
    compression legs for securing said wires; and
    tabs for releasing said compression legs.

13. An assembly for cooling comprising a fan-securing device for securing a fan to a cylindrical heat sink having fins arranged in a cylindrical configuration, wherein said assembly allows for the rapid removal of the fan without disturbing a remainder of the assembly, said assembly comprising:
    a cylindrical heat sink having fins arranged in a cylindrical configuration;
    a base disposed inside said cylindrical heat sink for releaseably receiving said fan and holding said fan at least partially inside said cylindrical heat sink;
    a fastener for securing said base to said cylindrical heat sink; and
    compression tabs for releaseably securing said fan to said base.

14. The assembly of claim 13, wherein said base is made of plastic.

15. The assembly of claim 13, further comprising:
a spring; and
a recessed receiver member in said base for receiving said spring directly wider the fan for aiding in discharge.

16. The assembly of claim 15, further comprising:
a spring retaining clip on a side of said recessed receiver member for retaining said spring in said recessed receiver member.

17. The assembly of claim 13, further comprising:
an slot in said fins of said cylindrical heat sink;
a wire guard for protecting fan wires front fan blades and sharp fin edges, said guard being integrally connected to said base and extending through said slot.

18. The assembly of claim 17, wherein said wire guard comprises:
compression legs for securing said wires; and
tabs for releasing said compression legs.

19. The assembly of claim 13, wherein said fastener comprises a screw that engages a corresponding hole in said fan-securing device and secures said base to said heat transfer device.

20. An assembly for cooling comprising a fan-securing device for securing a fan to a heat transfer device that allows for the rapid removal of the fan without disturbing a remainder of the assembly, said fan-securing device comprising:
a base having an axis along which said fan is inserted into said base; a fastener for securing said base to said heat transfer device; and
compression tabs for securing said fan to said base;
wherein said compression tabs extend upward from said base parallel to said axis and are flexible so as to be moved laterally with respect to said axis to permit said fan to be received in said base; and
wherein said tabs secure sides of said fan by moving in a direction substantially normal to said axis.

21. The assembly of claim 20, further comprising a groove or recess in said fan which is engaged by said compression tabs.

22. The assembly of claim 20, wherein said heat transfer device is a hear sink.

23. The assembly of claim 20, wherein said base is made of plastic.

24. The assembly of claim 20, further comprising:
a spring; and
a recessed receiver member in said base for receiving said spring directly under the fan for aiding in discharge.

25. The assembly claim 24, further comprising:
a spring retaining clip on a side of said recessed receiver member for retaining said spring in said recessed receiver member.

26. The assembly of claim 20, further comprising:
a wire guard for protecting fan wires from fan blades and sharp fin edges, said guard being integrally connected to said base.

27. The assembly of claim 26, wherein said wire guard comprises:
compression legs for securing said wires; and tabs for releasing said compression legs.

28. The assembly of claim 20, wherein said fastener comprises a screw that engages a corresponding hole in said fan-securing device and secures said base to said heat transfer device.

29. A method of securing a fan to a heat transfer device that allows for the rapid removal of the Ian without disturbing a remainder of the heat transfer device, said method comprising:
releaseably securing a base to said heat transfer device such that said base can be released from said heat transfer device;
releaseably securing said fan to said base;
facilitating release of amid fan from said base with a disposed in a recessed portion of said base.

30. The method of claim 29, wherein said releaseably securing said fan to said base comprises securing said fan to said base with compression tabs of said base.

31. A method of cooling with a fan-securing device and fan disposed in a cylindrical heat sink having fins arranged in a cylindrical configuration, wherein said method comprises:
securing a base inside said cylindrical heat sink, said base configured for releaseably receiving said fan; and
releaseably securing said fan in said base such that said fan is at least partially inside said cylindrical heat sink, wherein said releaseably securing said fan to said base comprises securing said fan to said base with compression tabs of said base.

32. A method of cooling with a fan-securing device and fan disposed in a cylindrical heat sink having fins arranged in a cylindrical configuration, wherein said method comprises:
securing a base inside said cylindrical heat sink, said base configured for releaseably receiving said fan;
releaseably securing said fan in said base such that said fan is at least partially inside said cylindrical heat sink; and
protecting fan wires from fan blades and sharp fin edges with a wire guard integrally connected to said base and extending through a slot in said fins of said cylindrical heat sink.

33. A method of cooling using an assembly that includes a fan-securing device for securing a fan to a heat transfer device, wherein said method allows for rapid removal of the fan without disturbing a remainder of the assembly, said method comprising:
deflecting flexible compression tabs of a base of said fan-securing device which extend upward in a direction substantially parallel to direction in which said fan is inserted into said base;
disposing said fan in said base by moving said fan past said deflected compression tabs; and
securing sides of said fan with said compression tabs by movement of said compression tabs in a direction substantially normal to said axis.

34. The method of claim 33, wherein said engaging is performed by engaging a groove or recess in said fan with said compression tabs.

* * * * *